(12) United States Patent
Takahashi

(10) Patent No.: US 8,013,235 B2
(45) Date of Patent: Sep. 6, 2011

(54) THERMOELECTRIC DEVICE

(75) Inventor: Koh Takahashi, Tokyo (JP)

(73) Assignee: Universal Entertainment Corporation, Tokyo (JP)

( * ) Notice: Subject to any disclaimer, the term of this patent is extended or adjusted under 35 U.S.C. 154(b) by 713 days.

(21) Appl. No.: 11/629,816

(22) PCT Filed: May 30, 2005

(86) PCT No.: PCT/JP2005/009910
§ 371 (c)(1),
(2), (4) Date: Mar. 14, 2007

(87) PCT Pub. No.: WO2005/124883
PCT Pub. Date: Dec. 29, 2005

(65) Prior Publication Data
US 2007/0240751 A1 Oct. 18, 2007

(30) Foreign Application Priority Data
Jun. 22, 2004 (JP) .................. 2004-183999

(51) Int. Cl.
*H01L 35/30* (2006.01)
*H01L 35/34* (2006.01)
*F01N 13/18* (2010.01)

(52) U.S. Cl. .................. 136/205; 136/201; 228/176

(58) Field of Classification Search .................. 136/201, 136/205; 228/176
See application file for complete search history.

(56) References Cited

U.S. PATENT DOCUMENTS

| | | | |
|---|---|---|---|
| 3,930,303 A | 1/1976 | Alais et al. | |
| 4,687,879 A | 8/1987 | Hendricks | |
| 5,875,098 A | 2/1999 | Leavitt et al. | |
| 2001/0001960 A1* | 5/2001 | Hiraishi et al. | 136/201 |
| 2002/0037621 A1* | 3/2002 | Kawazoe et al. | 438/296 |

FOREIGN PATENT DOCUMENTS

| | | |
|---|---|---|
| EP | 0 731 513 A1 | 9/1996 |
| JP | H08-139371 | 5/1996 |

(Continued)

OTHER PUBLICATIONS

Levi et al. "Micro-Welding" http://www.welding-advisers.com/Micro-welding.html 2005.*

(Continued)

*Primary Examiner* — Jessica L Ward
*Assistant Examiner* — Alexander Polyansky
(74) *Attorney, Agent, or Firm* — McGinn IP Law Group, PLLC

(57) ABSTRACT

A thermoelectric device, an intermediate, a module, and a method for manufacturing the same are provided, wherein productivity is high, material costs are comparatively low, and there is a low environmental load. A thermoelectric device, wherein a block body has at least one P and N piece made of P-type and N-type materials, which are alternately sandwiched between insulation layers, wherein the adjacent P and N piece boundary portions are welded together, with the P and the N piece of the block body being electrically connected in a zigzag manner, and a plurality of block bodies are arranged in parallel, the block bodies adjacent to each other being bridged by an electrode to extend the electrical connection in the series; an intermediate using such a thermoelectric device; and a thermoelectric module using the intermediate are provided. In this case, as the P-type and N-type materials, any material preferably used for thermoelectric pairs can be used.

14 Claims, 11 Drawing Sheets

FOREIGN PATENT DOCUMENTS

| | | | |
|---|---|---|---|
| JP | H08-148726 A | 7/1996 | |
| JP | H08-222771 A | 8/1996 | |
| JP | 09-074227 A | 3/1997 | |
| JP | 09-092891 A | 4/1997 | |
| JP | H10-335710 A | 12/1998 | |
| JP | H11-251649 A | 9/1999 | |
| JP | 2001-217469 | 8/2001 | |
| JP | 2001217469 A | * | 8/2001 |
| JP | 2003-318456 A | 11/2003 | |
| JP | 2004-221375 | 8/2004 | |

OTHER PUBLICATIONS

Chinese Office Action dated Nov. 21, 2008 with English-Language Translation.

Supplementary European Search Report dated Jan. 11, 2010.

* cited by examiner

THERMOELECTRIC DEVICE

TECHNICAL FIELD

The present invention relates to a thermoelectric device (including a thermoelectric transducer) and a method for manufacturing the same, and to a thermoelectric device using a P-type material and an N-type material, and a method for manufacturing the same. More specifically, the present invention relates to a thermoelectric device having P-type and N-type pieces capable of temperature difference power generation (thermal power generation) by Seebeck effect and electron cooling/heating with Peltier effect and a method for manufacturing the same.

BACKGROUND ART

In general, a thermoelectric device forms a PN junction pair by joining a P-type thermoelectric semiconductor and an N-type thermoelectric semiconductor via a metal electrode. It provides a temperature difference in the PN junction pair to generate electric power based on the Seebeck effect, so that it can function as an electrical generator. In addition, it can be also utilized as a temperature controller using the so-called Peltier effect, where one of the junction portions is cooled and the other thereof is heated by applying current to the device.

In general, the thermoelectric device is utilized by being incorporated in a thermomodule in which dozens to several hundreds of PN junction pairs (thermoelectric devices) are formed in series. The thermoelectric device used for the thermomodule maintains the shape as a structural body and is constructed of: two boards having metal electrodes to form a PN junction pair, a plurality of P-type and N-type thermoelectric semiconductors sandwiched between these boards, and a junction material for making a junction between the P-type and N-type elements and the metal electrodes.

Here, the P-type and N-type thermoelectric semiconductor materials include Bi—Te type materials, Fe—Si type materials, Si—Ge type materials, and Co—Sb type materials. Among them, in particular, the Bi—Te type materials are preferably used.

As described above, the thermoelectric device is provided as a n-type (pie type) device by connecting two different thermoelectric semiconductors, P-type and N-types. A number of such devices are connected in series to form an assembly of thermoelectric devices, thereby constructing a thermoelectric module. A $Bi_2Te_3$ based material has been mainly used as a material for the thermoelectric device as described above. However, it is considered to lead high material costs, lack of stability at high temperature, poor workability, and high environmental load. In addition, when the PN junction is formed via a lead plate, the contact resistance with the lead plate increases, so that the original capability of the material itself may not be fully achieved. On the other hand, a metal-based material, which is cheap and excellent in contact resistance, has a small Seebeck coefficient. Thus, it is particularly preferable that a sufficient electric power can be obtained when a lot of PN junction pairs are connected to each other in series.

These multiple PN junction pairs connected in series are, for example, a plurality of n-type elements arranged between two boards (Patent Document 1).

Patent Document 1: Japanese Unexamined Patent Application Publication No. Hei 11-251649 (FIG. 1)

DISCLOSURE OF THE INVENTION

Problems to be Solved by the Invention

However, the P-type and N-type thermoelectric semiconductors composed of $Bi_2Te_3$ based materials have poor workability, so that the productivity thereof may tend to be decreased, particularly in mass production. In addition, such semiconductors are not always suitable for mass production in view of their high material costs and large environmental loads.

The present invention has been carried out in view of the above problems and intends to provide a thermoelectric device having high productivity even in mass production, comparatively low material costs, and small environmental load; and to provide a method for manufacturing the thermoelectric device.

Means for Solving the Problems

The productivity can be retained while controlling the costs and environmental load when materials typically used for thermocouples are employed as P-type and N-type materials. In addition, an improvement in productivity can be expected by providing a production method corresponding to the characteristic features of materials typically used for thermocouples.

Materials typically used for thermocouples include: chromel-alumel typically known as a K-type thermocouple, platinum-platinum rhodium known as a R-type thermocouple, copper-constantan known as a T-type thermocouple, gold/iron-chromel known as a AF-type thermocouple, platinum-platinum 10% rhodium known as a S-type thermocouple, chromel-constantan known as an E type thermocouple, and tungsten-tungsten 26% rhenium known as a G type thermocouple. Among them, in particular, chromel-alumel can be preferably used in view of its usability and price.

More specifically, the present invention will provide the following.

According to a first aspect a thermoelectric block body including at least one P piece made of a P-type material and at least one N piece made of an N-type material, which are alternately sandwiched between insulation layers and extending in a direction of alternating alignment, wherein between end faces comprising external surfaces of the thermoelectric block body, each end face opposing another and arranged substantially parallel in the direction of alternating alignment, adjacent P piece and N piece boundary portions are alternately welded together, and the P piece and the N piece of the thermoelectric block body are electrically connected in a series of zigzags.

Here, the term "P piece" or "N piece" means that it is constructed of a P-type or N-type material and can be provided as a structural component of a PN thermoelectric device, while having predetermined dimensions. The predetermined dimensions are, not particularly limited in any way, providing that a size and shape are enough to allow them to be alternately sandwiched between insulation layers. For example, if each piece is in the form of a hexahedron shape, it has preferably a length of 0.5 to 5 mm, a width of 0.5 to 5 mm, and a height of 1 to 20 mm; more preferably a length of 1 to 5 mm, a width of 1 to 5 mm, and a height of 2 to 10 mm; and most preferably a length of 1 to 3 mm, a width of 1 to 3 mm, and a height of 3 to 7 mm. In this case, preferably, the abutting surfaces of the respective insulation layers sandwiched between the P piece and the N piece may have a substantially equivalent shape. Furthermore, the P-type and N-type materials may include materials generally used for thermoelectric devices. Among these materials, those suitable for the processing described below are more preferable.

The insulation layer can be mounted on an abutting surface in which the P piece and the N piece adjacent to each other are in contact with each other if the insulation layer is not placed. Such an insulation layer may cover the surface(s) of the P piece and/or N piece. Alternatively, for example, it may be an insulation film sandwiched between the P piece and the N piece. Furthermore, the term "insulation layer" used herein is not limited to a solid, and it may be a liquid or gas. Therefore, any space may be formed between the P piece and the N piece. Here, the insulation layer may be satisfied as long as it has an electrical insulation effect sufficient enough to allow a thermoelectric device to exert its functions.

In addition, the state in which the P piece and the N piece are alternately arranged may be one in which they are arranged such that the an N piece is placed next to a P piece, another P piece is placed next to the N piece, another N piece is placed next to the another P piece, and so on. Therefore, the direction of alternating alignment corresponds to a direction along which the P piece and the N piece are stacked one by one and extend. As they extend in the direction of alternating alignment, the resulting thermoelectric block body may be in the form of a bar shape having a narrow width. Two end faces facing each other among the external surfaces that define the thermoelectric block body substantially in parallel to the direction of alternating alignment may include heat-releasing or heat-absorbing faces or high-temperature or low-temperature faces of a plurality of PN thermoelectric devices that constitute the thermoelectric block body. For instance, when a thermoelectric block body in the form of a square bar shape includes an alternating alignment of the P piece and the N piece in the form of a dice shape in the direction of alternating alignment (i.e., an axial direction of the square bar), among four faces of the square bar, two faces facing each other may correspond to the so-called two end faces facing each other. In addition, there are two kinds of the faces facing each other. However, on the faces facing each other (corresponding to the side faces that define both the P piece and the N piece), two faces facing each other that can include welding portions that allow the P piece and the N piece adjacent to each other to be alternately welded correspond to each other.

These PN thermoelectric devices generally have electric connector portions on the end faces facing each other and each of them forms a heat-releasing or heat-absorbing face or high-temperature or low-temperature face. Therefore, it is more preferable to construct the heat-releasing or heat-absorbing face or high-temperature or low-temperature face by arranging these ends faces one by one in a line on a plane. The boundary portions of the P piece and the N piece adjacent to each other of these respective end faces facing each other are welded together to form electrical connections. An insulation layer is placed between the P piece and the N piece adjacent to each other, so that they can be insulated from each other in the vicinity of the end faces. However, a partial break or a bridge formed over the insulation layer can be obtained by such a welding procedure. The welding alternately welds and connects the end faces facing each other in the above direction of alternating alignment. Thus, the so-called n connections may be formed in a zigzag pattern to form a serial connection (chain) in the direction of alternating alignment.

The configuration of the above thermoelectric block body may start either from the P piece or the N piece, and these pieces are alternatively arranged and then terminated either of them. The phrase "thermoelectric block bodies having different phases are arranged in parallel" means that the alternating alignments of PN semiconductors of the respective directly adjacent thermoelectric block bodies do not correspond to each other. For instance, when two thermoelectric block bodies adjacent to each other are arranged in contact with each other, there is a relationship between, for example, the P piece of the first thermoelectric block body and the N piece of the second thermoelectric block body are adjacent to each other.

The electrode may equip an electrode plate, a lead wire, or the like. The electrode plate is generally called as a lead and used for electric supply or the like to a thermoelectric block body composed of thermoelectric devices. The electrode plate may be made of any material generally used for electrodes. The end of the thermoelectric block body may employ a portion located near the end in the above direction of alternating alignment or may be completely at the end thereof. The term "identically opposing relationship" means the relationship between two faces facing each other as described above, where their locations correspond to each other with respect to a heat-releasing or heat-absorbing face (or high-temperature face or low-temperature face). For instance, if two end faces are in an identically opposing the relationship, these end faces are heat-releasing faces together or heat-absorbing faces together. In addition, two end faces in an identically opposing relationship may be located on the top surface together or may be located on the bottom surface together.

According to a second aspect of a thermoelectric block body as described in the first aspect of the present invention, wherein the P piece is made of a thermocoupled cathode material and the N piece is made of a thermocoupled anode material.

According to a third aspect of a thermoelectric block body as described in the second aspect of the present invention, wherein the P piece is made of calomel and the N piece is made of chromel.

According to a fourth aspect of a thermoelectric block body as described in any of the first to third aspects of the present invention, wherein the welded joints are micro welded joints.

For the welding of the present invention, any of various known-welding technologies, such as soft soldering and hard soldering with brazing can be applied. Among them, however, it is more preferable to carry out micro welding. The micro welding technologies include various kinds of welding technologies, such as electric resistance welding, TIG welding, spot welding, electron beam welding, and laser welding. It is more preferable to apply any of laser welding technologies, such as $CO_2$ laser, YAG laser, and semiconductor laser.

According to a fifth aspect a thermoelectric module equipping a first thermoelectric block body having at least one P piece made of a P-type material and at least one N piece made of an N-type material, which are alternatively sandwiched between the insulation layers and extending in the direction of alternating alignment, wherein, between end faces comprising the external surfaces of the first thermoelectric block body, each end face opposing another and arranged substantially parallel in the direction of alternating alignment, adjacent P piece and N piece boundary portions are alternately welded together, and the P piece and the N piece of the first thermoelectric block body are electrically connected in a series of zigzags; a second thermoelectric body having at least one P piece made of a P-type material and at least one N piece made of an N-type material, which are alternately sandwiched between insulation layers and extending in the direction of alternating alignment, wherein, between the end faces comprising the external surfaces of the second thermoelectric block body, each end face opposing another and arranged substantially parallel in the direction of alternating alignment, adjacent P piece and N piece boundary portions are alternately welded together, and the P piece and the N piece of the second thermoelectric block body are electrically connected in a series of zigzags, the second thermoelectric block body having a phase that differs from the first thermoelectric block body, and being arranged such that the direction of alternating alignment of the second thermoelectric block body is substantially parallel to that of the first thermoelectric block body; and an electrode electrically connecting the first and second thermoelectric block bodies, allowing electric contact between the N piece and the P piece by being abutted to each of the respective P piece and N piece end faces which are in an identically opposing relationship, and disposed substantially at an end of each of the first and second thermoelectric block bodies in the direction of alternating alignment, thereby bridging the first and second thermoelectric block bodies.

According to a sixth aspect of a thermoelectric module as described in the fifth aspect of the present invention, wherein the P piece is made of a thermocoupled cathode material and the N piece is made of a thermocoupled anode material of the thermocouple.

According to the seventh aspect of a thermoelectric module as described in fifth aspect of the present invention, wherein the P piece is made of alumel and the N piece is made of chromel.

According to the eighth aspect of a thermoelectric module as described in any of the fifth to seventh aspects of the present invention, wherein the welded joints are micro welded joints.

According to a ninth aspect of a method for manufacturing an thermoelectric block assembly including: a lamination step for obtaining a laminated body by stacking a first sheet member made of a first material and a second sheet member made of a second material together; a first cutting step for obtaining a striped-pattern sheet member made of the first and second materials by cutting the laminated body; a first welding step for welding every other boundary portion on a first surface of the striped-pattern sheet member; a second welding step for welding every other boundary portion on a second surface of the striped-pattern sheet member with a phase different from the welding of the first welding step to obtain a welded striped-pattern sheet member with alternating zigzag bonding by junctions with the first surface and the second surface; a strip-cutting step for cutting the welded striped-pattern sheet member to obtain a strip-shaped thermoelectric block body; a parallel-arranging step for arranging a plurality of strip-shaped thermoelectric block bodies; and a bridging step for bridging the adjacent strip-shaped thermoelectric block bodies with an electrode plate.

According to a tenth aspect of a method for manufacturing a thermoelectric device module using a thermoelectric block assembly manufactured by the method as described in the ninth aspect of the present invention.

The present invention intends to provide a thermoelectric device, which can be produced by mass production while retaining high productivity, and the material costs and environmental load thereof can be easily controlled; and to provide a method for manufacturing the thermoelectric device.

Figure 1:
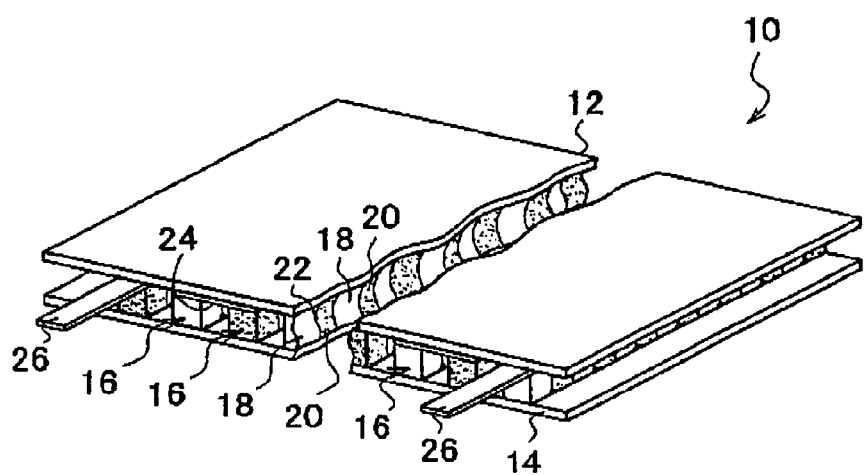
FIG. 1 is a partially fragmented cross-sectional view showing a thermoelectric module of an embodiment of the present invention.

| Explanation of Reference Numerals | |
|---|---|
| 10, 110 | thermoelectric module |
| 12, 14 | heat conduction plate |
| 16 | thermoelectric block body |
| 18 | P piece |
| 20 | N piece |
| 22, 122 | insulation layer |
| 24, 26, 124, 126 | electrode |
| 34 | laminated body |
| 36 | laminated sheet |
| 38 | top surface |
| 40 | laser device |
| 42, 48, 142 | welded portion |
| 112, 114 | alumina plate |
| 116 | thermocouple array |
| 118 | alumel plate |
| 120 | chromel plate |

PREFERRED MODE FOR CARRYING OUT THE INVENTION

Hereinafter, the present invention will be described with reference to the drawings.

Referring now to FIG. 1, a fragmented cross-sectional diagram of thermoelectric module 10 is shown as one of embodiments of the present invention.

Plural thermoelectric block bodies 16 are arranged in parallel between a heat conduction plate 12 on the high-temperature face (or low-temperature face) on the upper and a heat conduction plate 14 on a low-temperature face (or high-temperature face) on the lower, so that they are sandwiched between the heat conduction plates 12, 14 on the high-temperature and low-temperature faces in a heat-transferable state. Each of the thermoelectric block bodies 16 is mutually separated from the others in the lateral direction thereof and securing electrical insulation or the like. In addition, each of thermoelectric block bodies 16 is constructed of P pieces 18 made of a P-type material and N pieces 20 made of an N-type material, which are alternately arranged in connection with each other and extend in the form of a bar. On the boundary of the P piece and the N piece adjacent to each other, there is provided the so-called insulation layer 22 for electrical insulation. The insulation an entirety of the end portion of at least one of P pieces 18 and an entirety of the end portion of at least one of N pieces 20.

The thermoelectric block bodies 16 adjacent to each other have their respective alternating arrangements of the P piece and the N piece with phases shifted from one another, so that a piece just on the side direction (e.g., N piece) can be a different type of piece (e.g., P piece). For example, a piece just proximal to the side direction of P piece 18 of the thermoelectric block body 16 and residing in the adjoining thermoelectric block body 16 is an N piece.

The thermoelectric block bodies 16 adjacent to each other are bridged by an electrode 24 on the end in the abovementioned direction of alternating alignment (the same direction) to secure the electric conductivity between the thermoelectric block bodies 16. On the other end in the direction of alternating alignment, likewise, an electrode makes a bridge connection between the thermoelectric block bodies 16 adjacent to each other on the side opposite to the previously-mentioned thermoelectric block bodies 16 adjacent to each other, thereby forming a plurality of thermoelectric pieces in serial connection in a plurality of the thermoelectric block bodies 16.

The thermoelectric block bodies on the right and left ends of the thermoelectric module 10 connect with lead electrodes 26, respectively, thereby allowing the supply of electric power from an external power supply or allowing electric power transmission generated by thermoelectric effect.

In the above description, P-type and N-type semiconductors are described. However, they can be described by replacing them with cathode and anode materials typically used for thermocouple. For instance, when chromel-alumel thermocouple materials are used, alumel is used for P type semiconductor and chromel is used for N-type semiconductor. Hereinafter, from FIG. 1, the P piece 18 described in FIG. 1 means an alumel layer and the N piece 20 means a chromel layer. Materials generally used for thermocouple can be referenced in the following table:

TABLE 1

| JIS Code | +pier | −pier | operating temperature range | overheated operating temperature limit | Characteristics |
|---|---|---|---|---|---|
| K | chromel | alumel | −200° C. to 1000° C. | 1200° C. | Linear relationship between temperature and thermal electromotive force, mostly used for industrial use. |
| J | iron | constantan | 0° C. to 600° C. | 750° C. | High thermal electromotive force but second only to E thermocouple, used for industrial use at intermediate temperature range. |
| T | copper | constantan | −200° C. to 300° C. | 350° C. | Small electric resistance, stable thermal electromotive force, and widely used for accurate measurements at low temperature. |
| E | chromel | constantan | −200° C. to 700° C. | 800° C. | Highest thermal electromotive force among thermocouples defined by JIS. |
| N | nichrocyl | nicyl | 0° C. to 1400° C. | 1600° C. | Stable thermal electromotive force at wide temperature range from low to high temperatures. |
| R | Platinum—13% rhodium | platinum | 0° C. to 1400° C. | 1600° C. | Suitable for accurately measuring inert gas at high temperatures under an oxidative atmosphere. Since there is a high accuracy with less variation and deterioration, these are used as standard thermocouples. |
| S | Platinum—80% rhodium | platinum | 0° C. to 1400° C. | 1600° C. | |
| B | Platinum—90% rhodium | platinum—6% rhodium | 0° C. to 1500° C. | 1700° C. | Thermocouple having highest operating temperature among JIS-defined thermocouples. |

TABLE 1-continued

| JIS Code | +pier | −pier | operating temperature range | overheated operating temperature limit | Characteristics |
|---|---|---|---|---|---|
| *AF | chromel | gold · iron | −269° C. to 30° C. | — | Thermocouples most suitable for measurement at ultra-cold temperatures. |
| * | iridium | iridium—50% rhodium | 1100° C. to 2000° C. | 2100° C. | Thermocouple suitable for a vacuum, an inert gas, and a slightly oxidative atmosphere, contamination with iridium vapor |
| * | tungsten | tungsten | 0° C. to 2400° C. | 3000° C. | Thermocouple suitable for reduction atmosphere, inert gas, and hydrogen gas. It is weak. |

*not meet JIS
The term "overheated operating temperature limit" means the limit of temperature that can be employed in a short time from unavoidable circumstances.

In FIGS. 2 to 7, a method for manufacturing the above thermoelectric module 10 will be schematically described.

Figure 2:
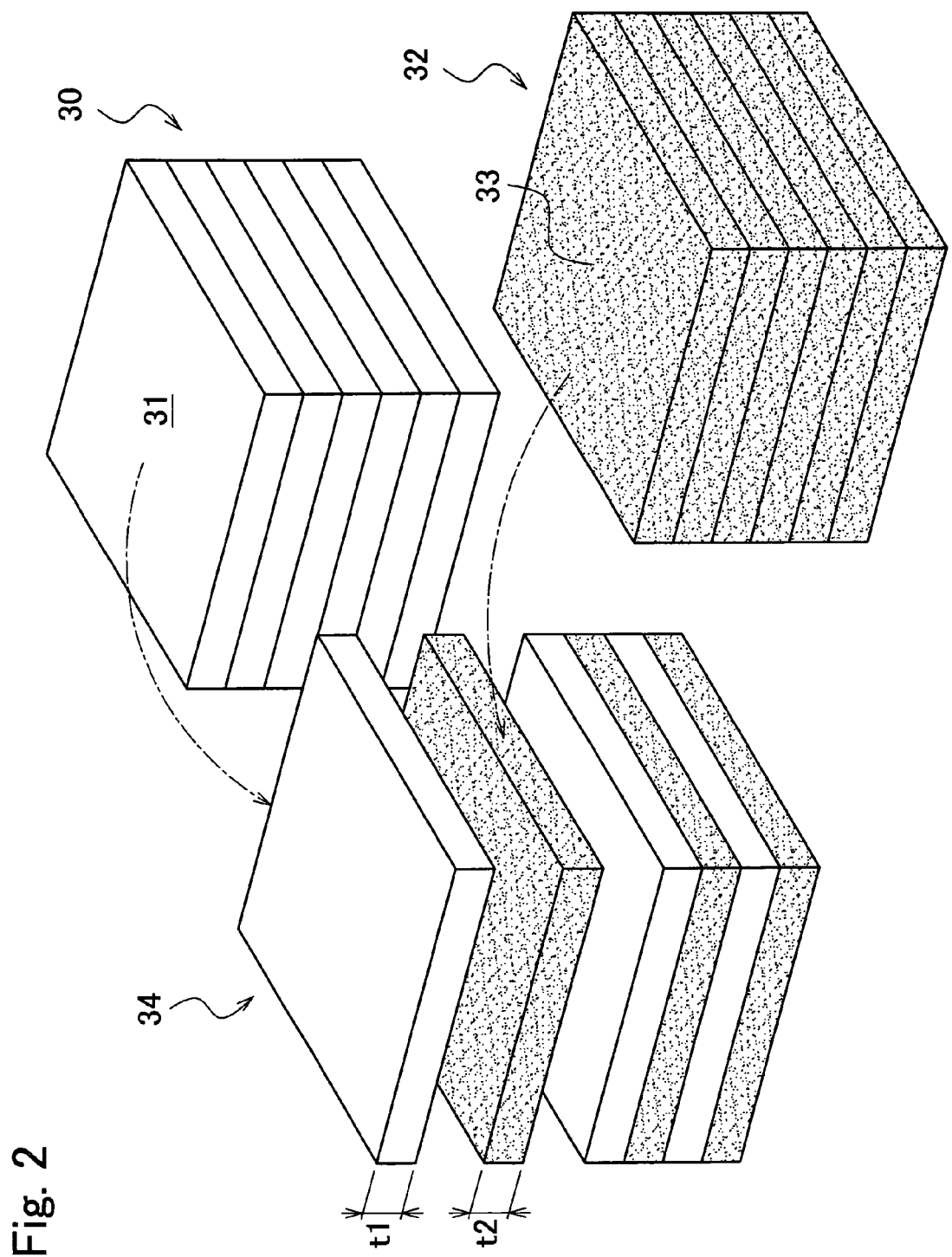
FIG. 2 is a perspective view showing a laminated body being obtained by stacking thin plates made of two different materials in the process of preparing the thermoelectric module shown in FIG. 1.

FIG. 2 shows a state of alternatively stacking thin alumel plates 30, where one side 31 thereof is subjected to an insulation treatment, and thin chromel plates 32, where one side 33 thereof is subjected to an insulation treatment. The alumel plate 30 has a plate thickness t1 of about 2 mm and the chromel plate 32 has a plate thickness t2 of about 2 mm. The thermal treatment provides both surfaces 31, 33 with their respective organic insulation films and plays an additive like role with the alternating lamination. Such lamination is carried out up to the desired number of layers, thereby obtaining the desired laminated body 34.

Figure 3A:
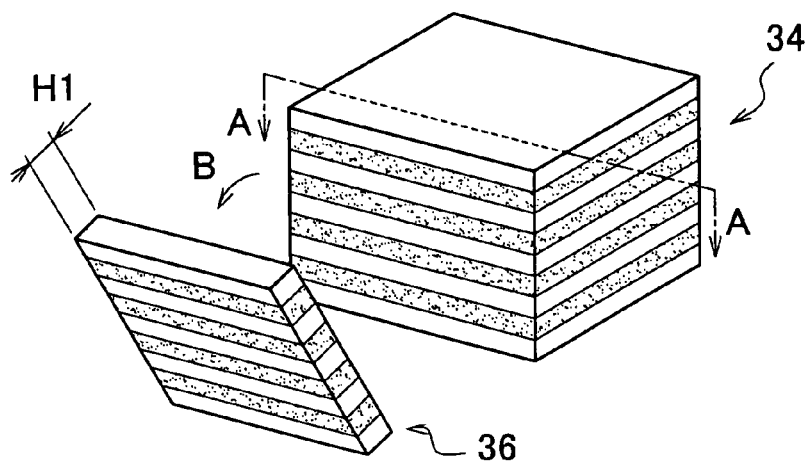
FIG. 3A is a perspective view showing the laminated body obtained in FIG. 2 being cut into plates.

FIG. 3A shows the step of cutting a laminated body 34 into thin plates along the cutting plane AA. The cutting may be curried out using a normal fine cutter or the like. As indicated by the arrow B, the thin plate 36 having a striped pattern of separated alumel and chromel has a plate thickness H1 of 2 mm.

Figure 3B:
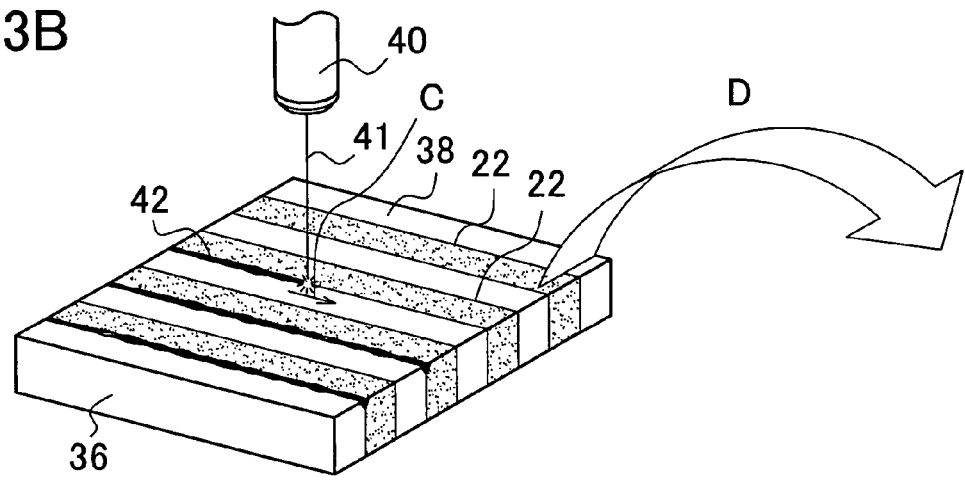
FIG. 3B is a perspective view showing laser welding being performed on the surface of a plate obtained in FIG. 3A.

In FIG. 3B, the resulting thin plate 36 having a striped pattern is left standing such that one of two large plate surfaces is placed on the lower side and faced upward, while the other is plated on the upper side and faced downward, thereby revealing the arrangement of a boundary insulation layer 22 sandwiched between the alumel layer 18 of the top surface 33 and the chromel layer 20 (see FIG. 1). The insulation layer 22 exposed from the top surface 38 is constructed of a boundary portion between an alumel layer and a chromel layer, so that it cannot be electrically connected if nothing is done. The boundary portion (in the figure, represented as a line extending from right to left) is heated by laser beam 41 from a laser device 40 to continuously carry out an electrical connection along the arrow C. At the welding portion 42, both the alumel layer 18 and the chromel layer 20 can attain electrical connection on the top surface 38. The laser welding is performed on every other line extending from right to left in a front to back direction.

Figure 3C:
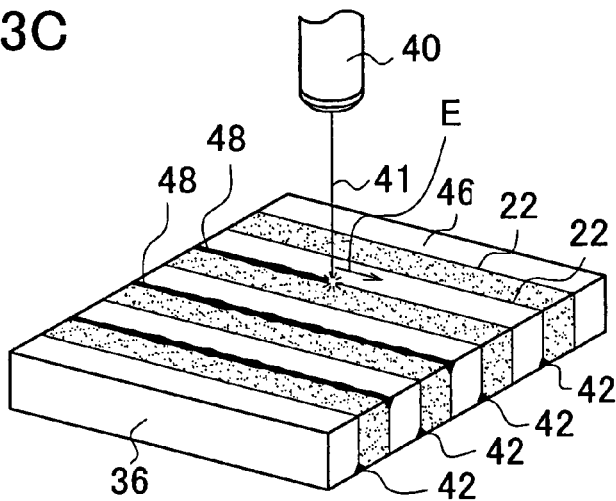
FIG. 3C is a perspective view showing laser welding being performed on the back of a plate obtained in FIG. 3A.

Next, along the arrow D, the above thin plate 36 of a striped pattern is reversed to turn the top surface 38 downward and then left standing again (FIG. 3C). The portion 42 welded in FIG. 3B is arranged on the lower side in this figure. Here, the other surface 46 is subjected to the laser welding in a manner similar to the above description, thereby continuously performing welding and joining of both the alumel layer 18 and the chromel layer 20 on the other surface 46 as indicated by the arrow E. Consequently, the welded portion 48 can electrically connect the alumel layer 18 with the chromel layer 20 on the other surface 46. The welding is carried out alternately on the other surface 48 so as to be alternated with the top surface 38. Consequently, the alumel layers 18 and the chromel layers 20 are electrically connected in series from the front to the back in a series of zigzag.

Figure 4:
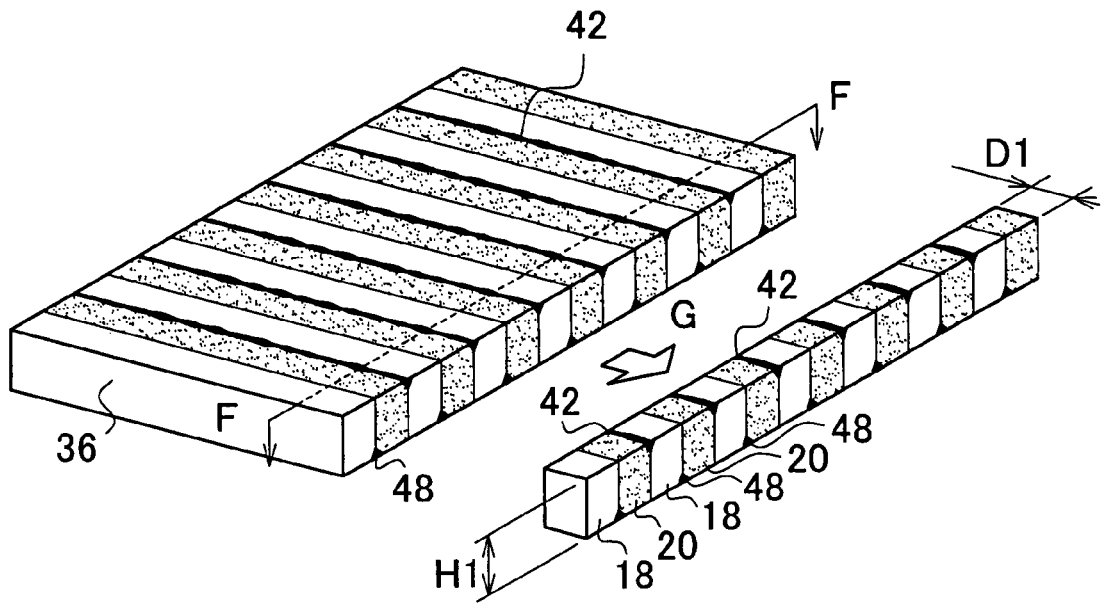
FIG. 4 is a perspective view showing a thermoelectric block body being obtained by cutting a thin plate welded in Figs. A to C into strips.

FIG. 4 shows the step of cutting a striped pattern thin plate 36 into pieces, where both surfaces thereof are alternately subjected to laser welding. Cutting can be performed with a fine cutter to cut out as indicated by the arrow G, thereby forming one thermoelectric block body 16. The height H1 of the thermoelectric block body 16 corresponds to the plate thickness of the striped pattern thin plate 36 and the width D1 thereof corresponds to the cutting width D1. Here, both H1 and D1 are defined as 2 mm, respectively.

Figure 5:
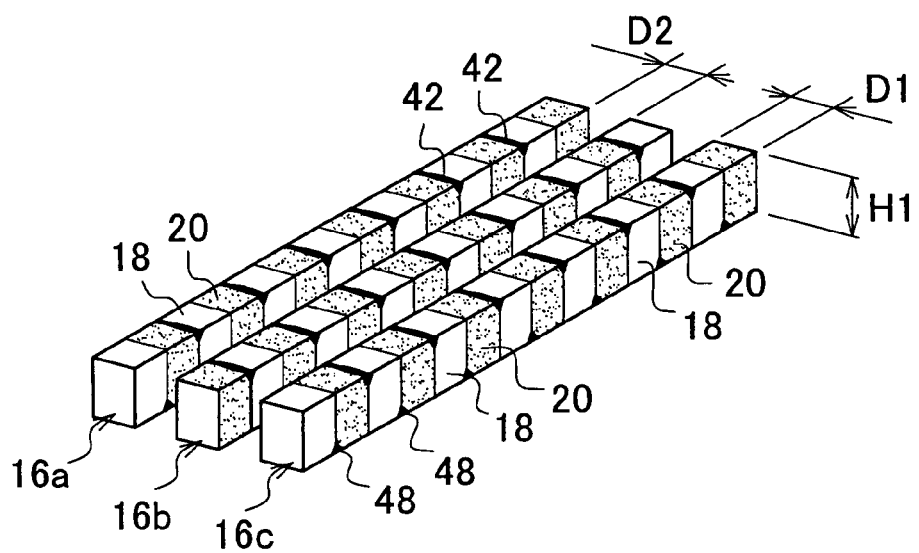
FIG. 5 is a perspective view showing a state of thermoelectric block bodies obtained in FIG. 4 arranged in parallel.

FIG. 5 shows that thermoelectric block bodies 16a, b, and c cut out in FIG. 4 are parallel arranged in sequence from the left with a space D2. It is desired that the thermoelectric block bodies are connected with each other through welded portions 42, 48 such that the PN junctions are provided in series in the direction of alternating alignment in a series of zigzag. In this case, the respective thermoelectric block bodies 16a, b, c, preferably have the same height. This is because the top and bottom surfaces of each of the thermoelectric block bodies 16a, b, c may be provided as a heat-releasing or absorbing face or a high-temperature or low-temperature face, and heat conduction to heat conduction plates 12, 14 may be preferably carried out uniformly. In addition, it is preferable that the surface of the conduction plate 12, 14 may have uniform temperature.

Figure 6:
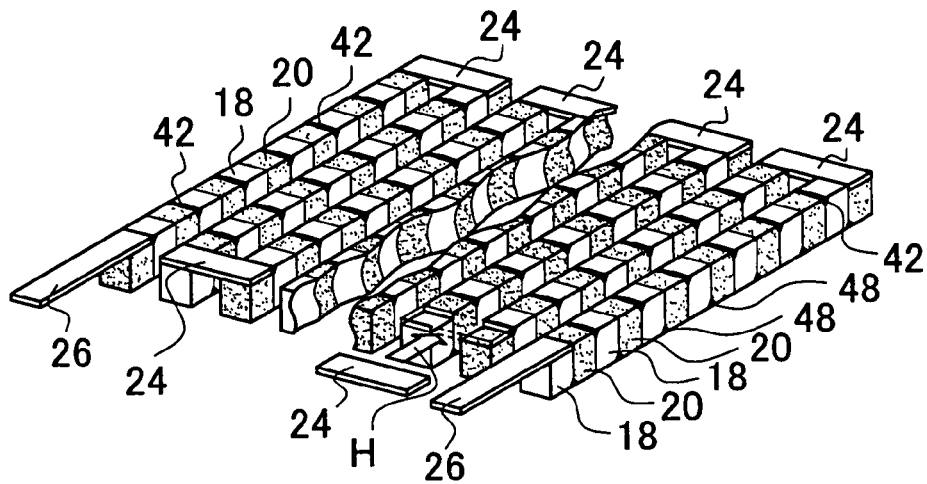
FIG. 6 is a perspective view showing the thermoelectric block bodies arranged in parallel being connected.
Figure 7:
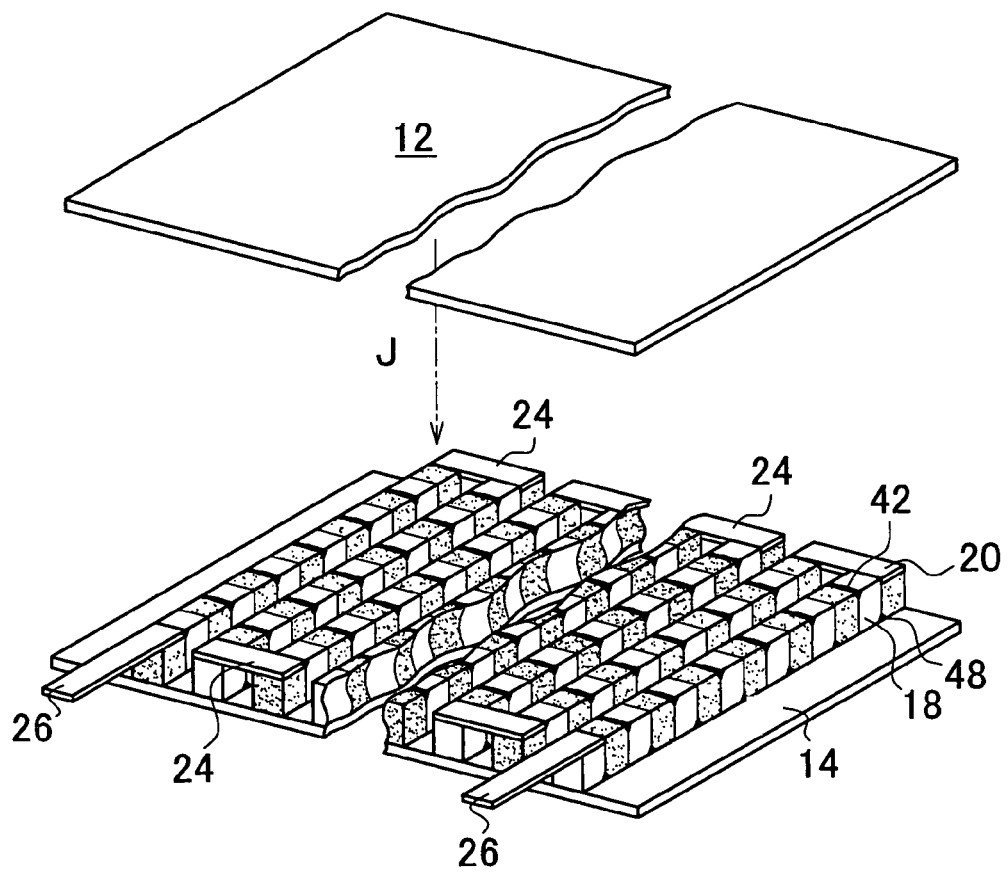
FIG. 7 is a perspective view showing a thermoelectric module being obtained by assembling thermoelectric block body assembles which are arranged and connected in parallel.

FIG. 6 shows a serial connection of P-type and N-type semiconductors as a whole by attaching lead electrodes 26 and electrodes 24 on a predetermined number of thermoelectric block bodies 16 arranged in parallel as described above (arrow H). All of the respective thermoelectric block bodies 16 can be parallel arranged in series by alternately connecting electrodes 24 on the end of each thermoelectric block body 16. FIG. 7 shows a state in which the assembly of thermoelectric bodies 16 connected as described above is sandwiched between the top and bottom heat conduction plates 12, 14 (arrow J). Consequently, the thermoelectric module of FIG. 1 can be produced.

FIGS. 8 to 12, illustrate another embodiment of the present invention.

Figure 8:
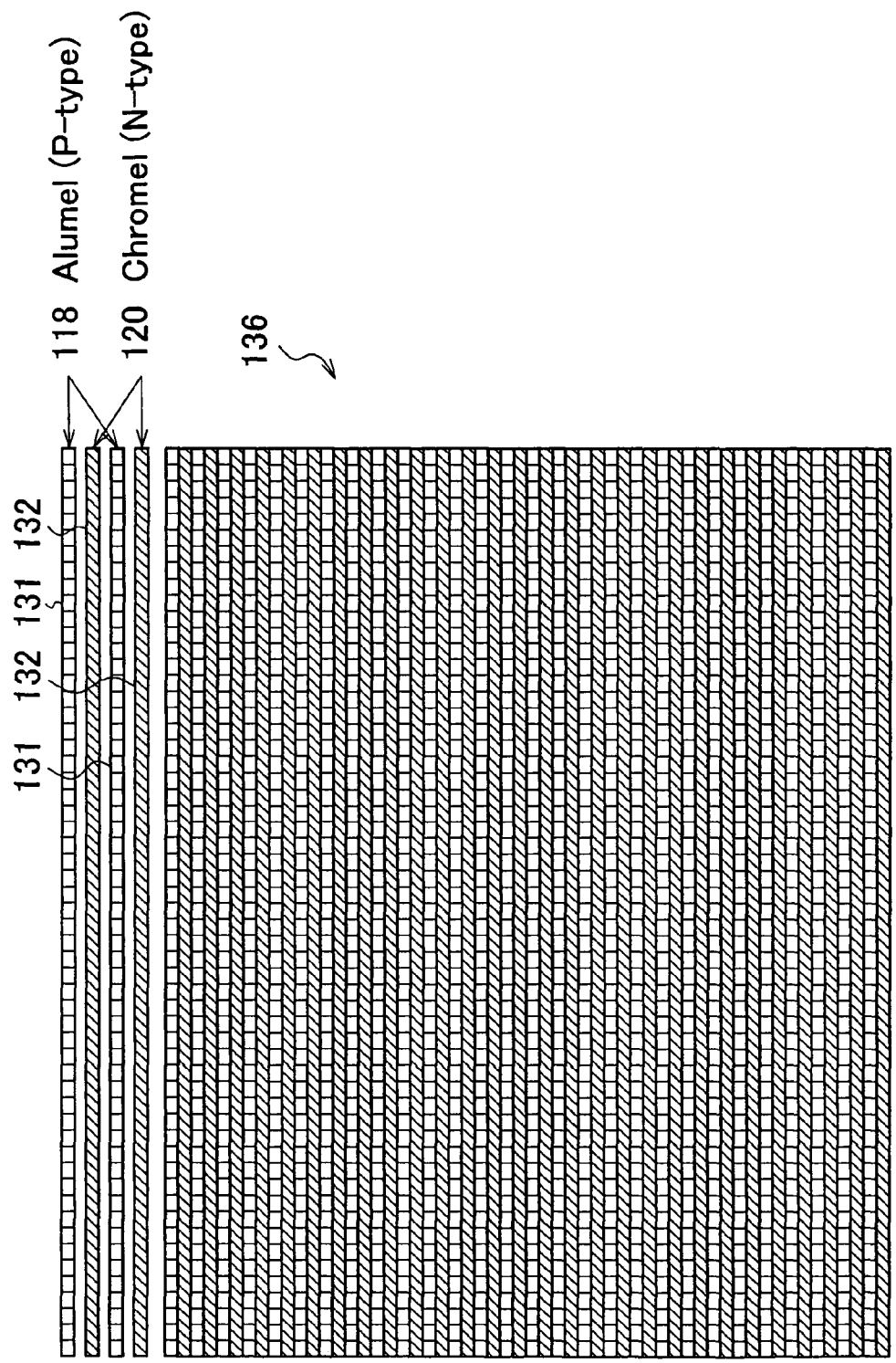
FIG. 8 is a side view showing two kinds of foils being stacked in the process of preparing a thermoelectric module of another embodiment of the present invention.

FIG. 8 illustrates a laminated sheet 136 prepared by alternately stacking 25 alumel plates 118 each having dimensions of 100 mm×5 mm×2 mm and 25 chromel plates 120 having the same dimensions, in which the surfaces thereof are subjected to an insulation treatment.

The insulation treatment is carried out on the top surface 131 of the alumel plate 118 and the top surface 132 of the chromel plate 122. Consequently, an insulation layer 122 was formed between the alumel plate 118 and the chromel plate 120.

Figure 9A:
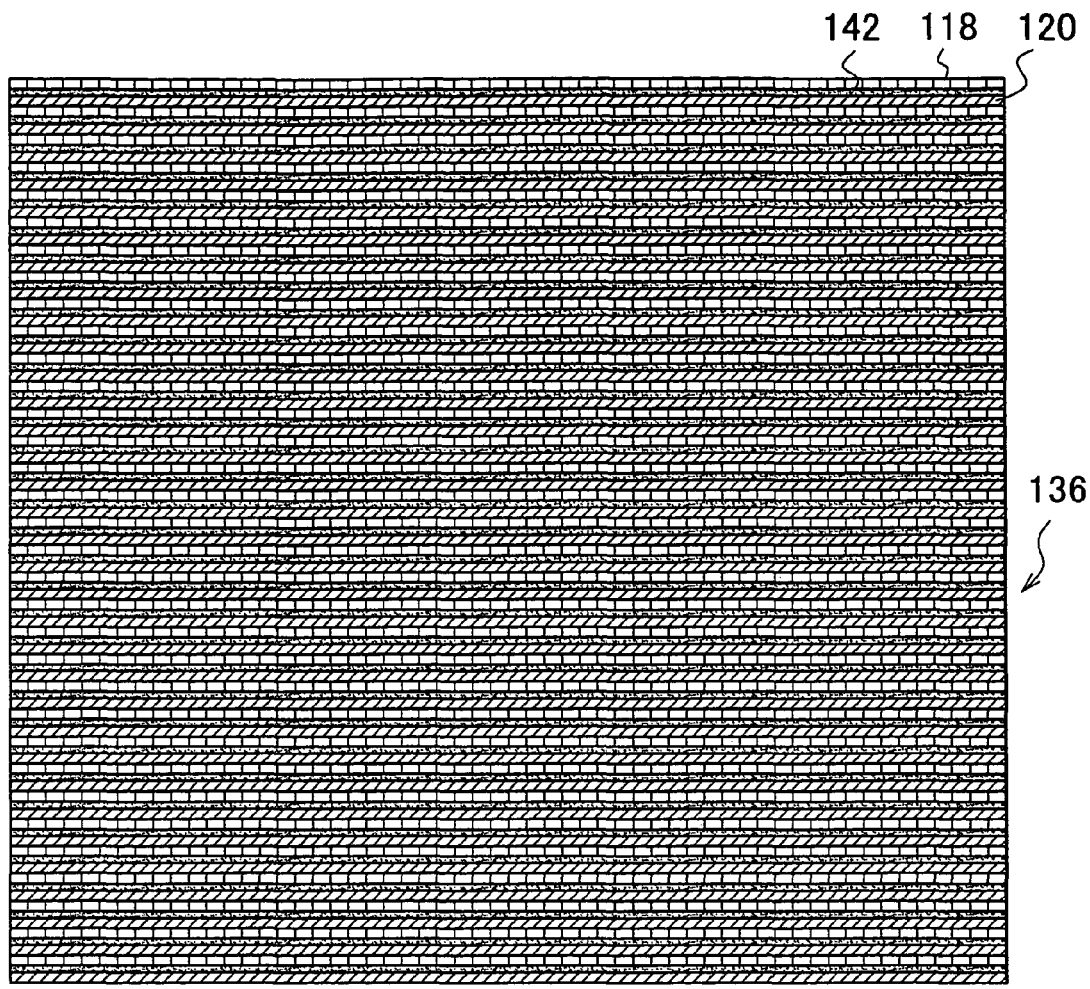
FIG. 9A is a view showing the side of a laminated body obtained by laser welding on the side of the laminated body stacked in FIG. 8.
Figure 9B:
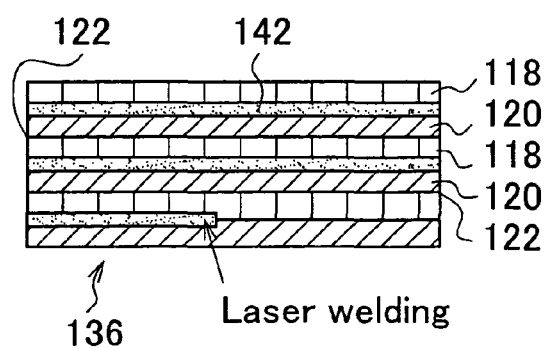
FIG. 9B is an enlarged view showing laser welding being carried out on the side of the laminated body stacked in FIG. 8.

FIGS. 9A and 9B show linear welding of every other contact portion between the alumel plate 118 and the chromel plate 120 on the surface of the laminated plate 136 (FIG. 9B) and the laminated sheet 136 after the welding (FIG. 9A). Welding in vertical direction at every other boundary line between the alumel plate 118 and the chromel plate 120 extending from right to leave forms the welded portion 142 on this surface. The surface opposite to the above surface is subjected to welding so that its welding position is shifted.

Figure 10:
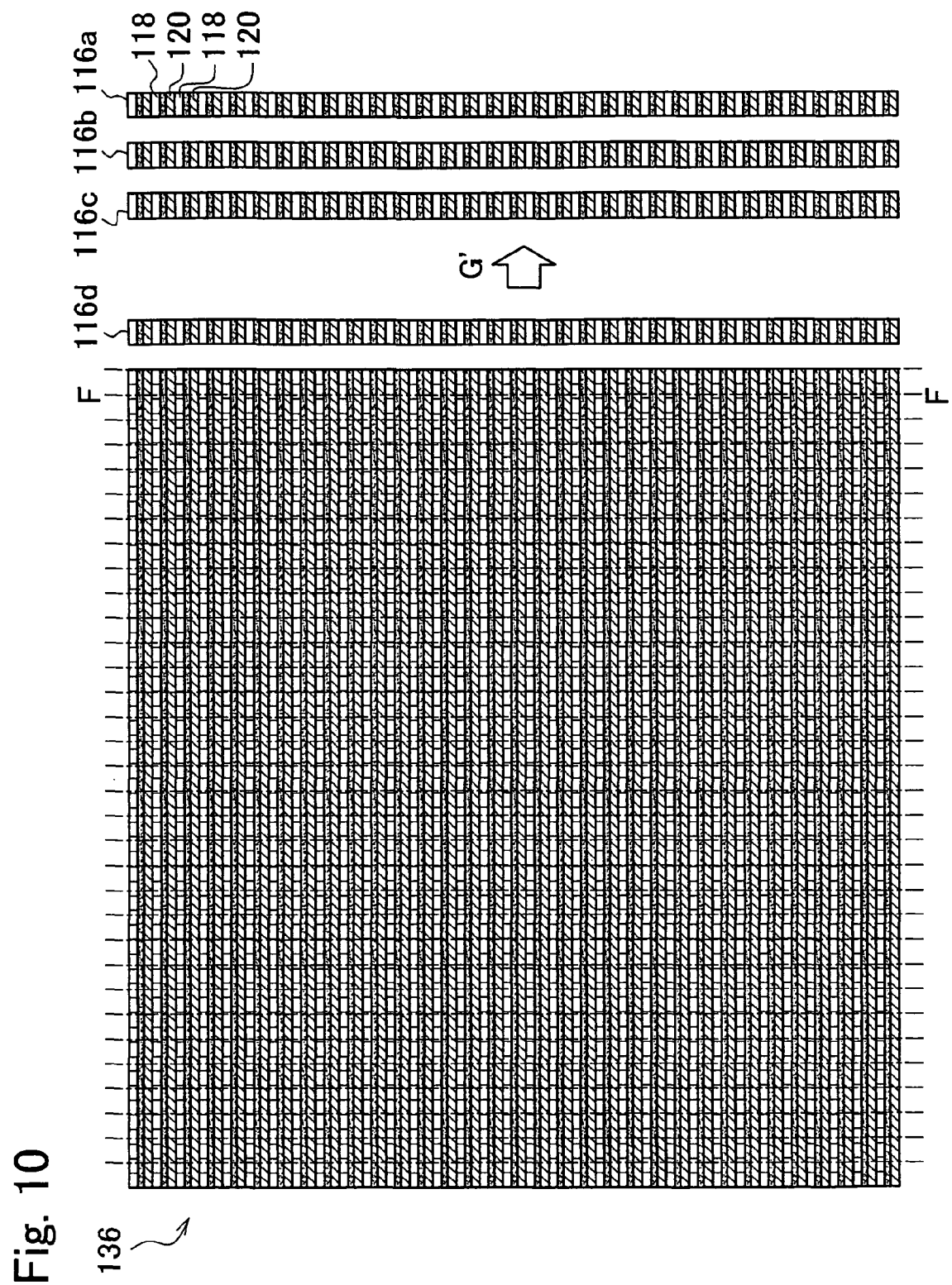
FIG. 10 is a view showing the laminated body welded in FIGS. 9A and B being chopped into small pieces.

FIG. 10 shows that a fine cutter cuts the laminated sheet 136 along the cutting line F-F into strip pieces. The resulting strip pieces have a width of 2 mm, so that the thermoelectric block bodies 116a, b, c, and d (the arrow G') can be separated. Here, the reason of defining the width 2 mm is that if the width is higher (e.g., 4 mm), the number of thermoelectric block bodies 116, which can be lined up in unit area decreases, thereby lowering the potential generated by temperature difference. If it is narrower, the handling becomes more complicated. However, this width is not a fixed one but it can be suitably defined depending on the usage. In this way, the thermocouple array is provided as one having 25 pairs of an alumel-chromel thermocouple in the form of a bar shape.

Figure 11:
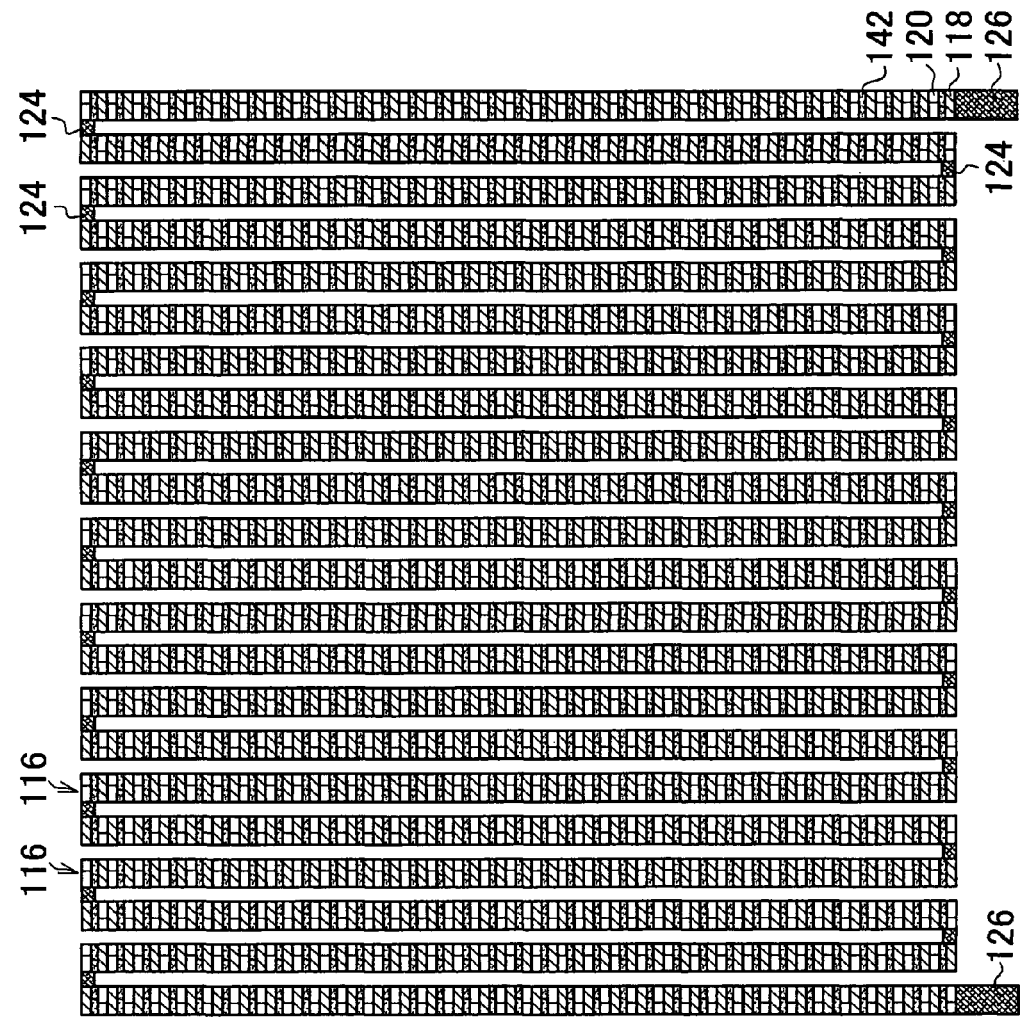
FIG. 11 is a view showing small pieces of the chopped laminated body being arranged in parallel and serially connected as a whole.
Figure 12:
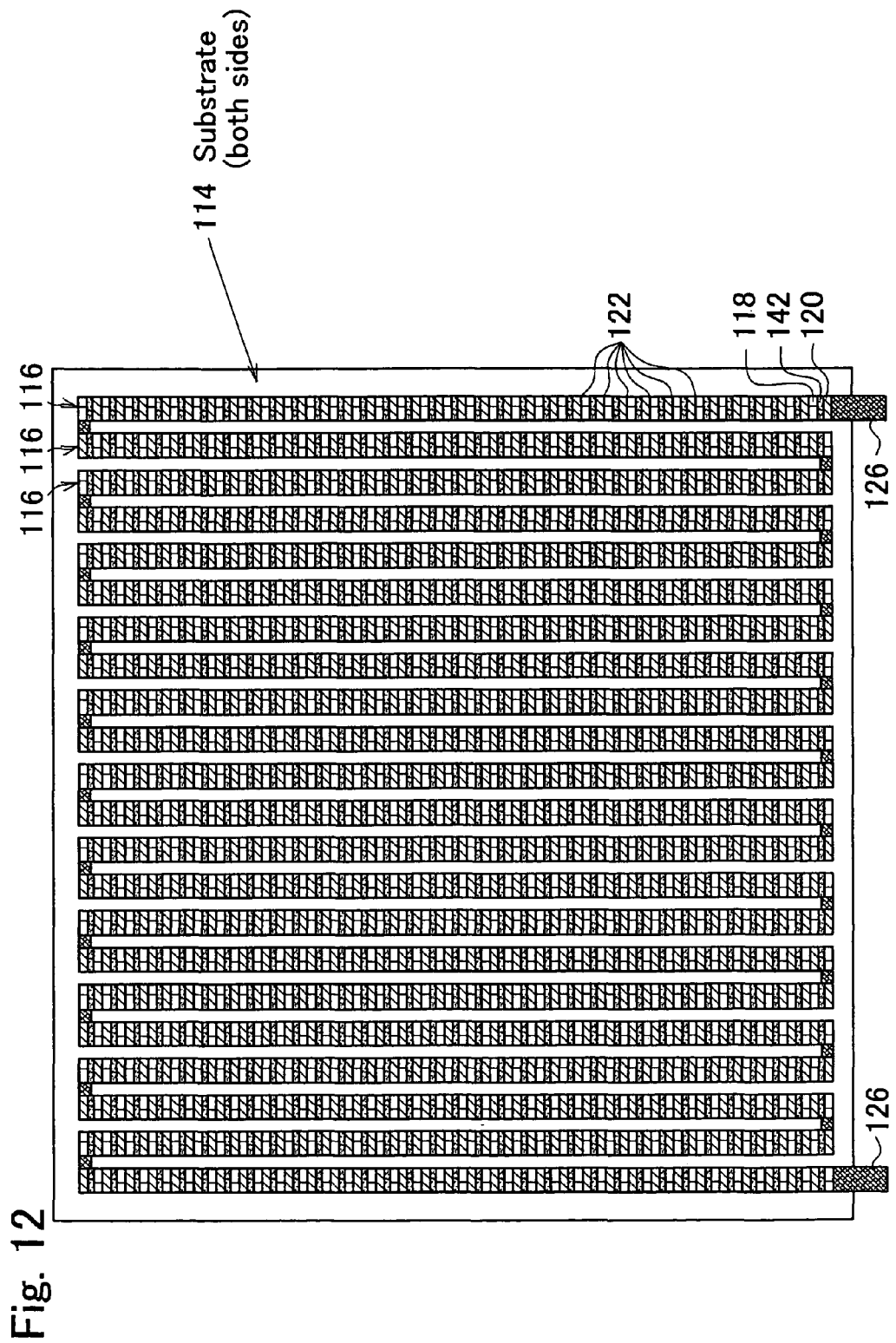
FIG. 12 is a view showing a serially connected assembly obtained in FIG. 11 being arranged on a board.

As shown in FIGS. 11 and 12, 50 thermocouple arrays (or thermoelectric block bodies) 116 are serially connected, arranged, and fixed on an alumina plate 114 as a heat conduction plate having 120 mm×120 mm×2 mm. The ends of a lead wire 124 are welded on the respective thermoelectric block bodies 116, thereby connecting between the respective thermoelectric block bodies 116. In addition, external terminals 126 are connected with both ends of a plurality of serially connected thermoelectric block bodies 116 by welding. In addition, they are fixed with a screw from the top surface to the alumina plate (not shown) to provide a thermoelectric module as an assembly of 1250 pairs of alumel-chromel thermocouples.

Figure 13:
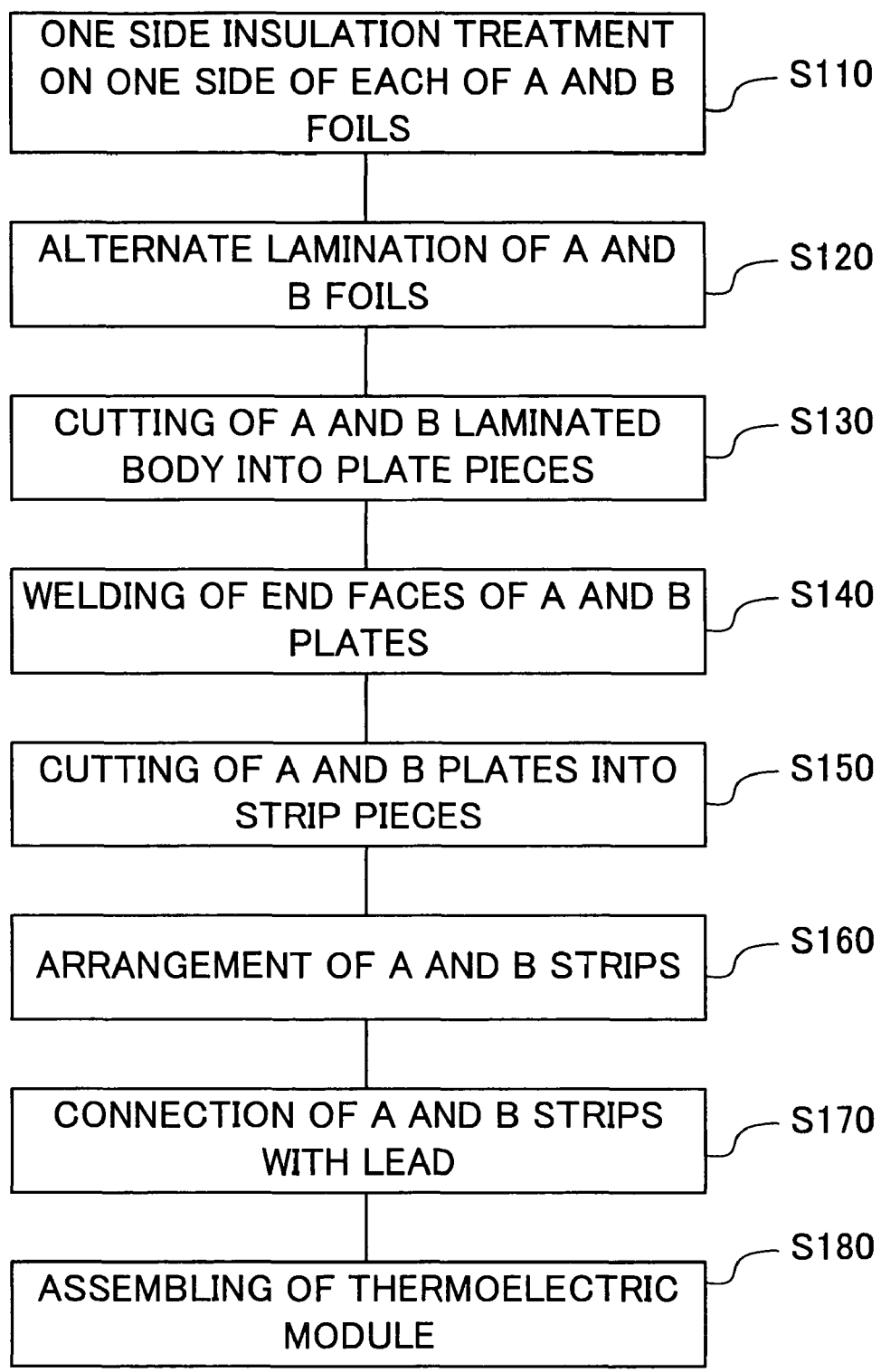
FIG. 13 is a flowchart for illustrating the process of preparing a thermoelectric module of an embodiment of the present invention.

Referring now to FIG. 13, a flowchart shows a method for manufacturing a thermoelectric module described above. At first, one end (or optionally both ends) of each of the two different foils A, B used for a thermoelectric device is subjected to an insulation treatment (S110). Then, the two different foils A, B are stacked together, thereby providing a laminated body (S120). The resulting AB laminated body is cut into thin films if required (S130). If the width of the laminated body is too small, then the cutting step can be omitted. Subsequently, the AB boundaries are alternately welded on both end surfaces of an AB laminated body provided as a thin plate (S140). At this time, the back and top surfaces are alternately welded. The welded AB laminated plate is cut into strip pieces (S150). A strip-shaped thermoelectric block body of the AB laminated body (also referred to as array) is separated and arranged in parallel on a plane (S160). Lead connections are alternately performed on the ends of the thermoelectric block body, at which the locations thereof are fixed (S170). Finally, a thermoelectric device module is fabricated by attaching the heat conduction plates on the top and bottom surfaces of the assembly of thermoelectric block bodies (S180).

Examples

The bottom surface of a thermoelectric module as shown in FIGS. 8 to 12 and prepared according to the flowchart in FIG. 13 was heated by a heater, while the top surface thereof was cooled to provide the module with a temperature difference of about 175 K between the top and bottom surface, thereby resulting in an open-circuit voltage of 8.75 V and a maximum output of 10.1 W. In addition, a cooling amount of 59 W was obtained when a current 8 A was applied on the thermoelectric module 8 A.

As described above, a PN junction array, depending on the number of laminations, can be easily prepared by alternately stacking P-type and N-type materials (such as semiconductors and metal thin plates) and then welding the PN boundaries on the both ends, followed by cutting perpendicularly to the lamination surface. Furthermore, plural PN junction arrays are connected in series, thereby obtaining a thermoelectric conversion module having a large amount of PN junctions.

The invention claimed is:

1. A thermoelectric block body, comprising:
   at least one P piece comprising a P-type material; and
   at least one N piece comprising an N-type material, the at least one N piece being arranged alternately with the at least one P piece while interposing an insulation layer therebetween and extending in a direction of alternate arrangement,
   wherein a boundary portion is welded at an external surface of the thermoelectric block body, the boundary portion including an end portion of one of the at least one P piece, the interposed insulation layer, and an end portion of one of the at least one N piece, and the interposed insulation layer covering an entirety of the end portion of the one of the at least one P piece and an entirety of the end portion of the one of the at least one N piece,
   wherein other boundary portions are welded at an other external surface of the thermoelectric block body, the other boundary portions being respectively adjacent to the one of the at least one P piece and the one of the at least one N piece,
   wherein the external surface and the other external surface are opposite to each other and substantially parallel with the direction of alternate arrangement, such that P pieces and N pieces are alternately connected while welded portions lie zigzag at the external surface and the other external surface such that a serial connection is electrically established.

2. A thermoelectric block body according to claim 1, wherein the at least one P piece comprises a cathode material of a thermocouple device, and
   wherein the at least one N piece comprises an anode material of the thermocouple device.

3. A thermoelectric block body according to claim 2, wherein the at least one P piece comprises alumel, and
   wherein the at least one N piece comprises chromel.

4. A thermoelectric block body according to claim 1, wherein the welded joints comprise micro-welded joints.

5. A thermoelectric module, comprising:
   a first thermoelectric block body, comprising:
      at least one P piece comprising a P-type material; and
      at least one N piece comprising an N-type material, the at least one N piece of the first thermoelectric block body being alternately arranged with the at least one P piece of the first thermoelectric block body while interposing an insulation layer therebetween and extending in a first direction of alternate arrangement;
   a second thermoelectric block body, comprising:
      at least one P piece comprising a P-type material; and
      at least one N piece comprising an N-type material, the at least one N piece of the second thermoelectric block body being alternately arranged with the at least one P piece of the second thermoelectric block body while interposing an insulation layer therebetween and extending in a second direction of alternate arrangement; and an electrode attached to a spatially facing pair of a P piece and an N piece that are placed at ends of the first thermoelectric block body and the second thermoelectric block body with respect to the first direction and the second direction of alternate arrangement, the electrode allowing electric continuity to be established between the spatially facing pair such that the first thermoelectric block body and the second thermoelectric block body are electrically connected, wherein a boundary portion of the first thermoelectric block body is welded at an external surface of the first thermoelectric block body, the boundary portion of the first thermoelectric block body including an end portion of one of the at least one P piece of the first thermoelectric block body, the interposed insulation layer of the first thermoelectric block body, and an end portion of one of the at least one N piece of the first thermoelectric block body, and the interposed insulation layer covering an entirety of the end portion of the one of the at least one P piece and an entirety of the end portion of the one of the at least one N piece, wherein other boundary portions of the first thermoelectric block body are welded at an other external surface of the first thermoelectric block body, the other boundary portions of the first thermoelectric block body being respectively adjacent to the one of the at least one P piece of the first thermoelectric block body and the one of the at least one N piece of the first thermoelectric block body, wherein the external surface of the first thermoelectric block body and the other external surface of the first thermoelectric block body are opposite to each other and substantially parallel with the first direction of alternate arrangement, such that P pieces of the first thermoelectric block body and N pieces of the first thermoelectric block body are alternately connected while welded portions lie zigzag at the external surface of the first thermoelectric block body and the other external surface of the first thermoelectric block body such that a serial connection is electrically established, wherein a boundary portion of the second thermoelectric block body is welded at an external surface of the second thermoelectric block body, the boundary portion of the second thermoelectric block body including an end portion of one of the at least one P piece of the second thermoelectric block body, the interposed insulation layer of the second thermoelectric block body, and an end portion of one of the at least one N piece of the second thermoelectric block body, and the interposed insulation layer covering an entirety of the end portion of the one of the at least one P piece and an entirety of the end portion of the one of the at least one N piece, wherein other boundary portions of the second thermoelectric block body are welded at an other external surface of the second thermoelectric block body, the other boundary portions of the second thermoelectric block body being respectively adjacent to the one of the at least one P piece of the second thermoelectric block body and the one of the at least one N piece of the second thermoelectric block body, wherein the external surface of the second thermoelectric block body and the other external surface of the second thermoelectric block body are opposite to each other and substantially parallel with the second direction of alternate arrangement such that P pieces of the second thermoelectric block body and N pieces of the second thermoelectric block body are alternately connected while welded portions lie zigzag at the external surface of the second thermoelectric block body and the other external surface of the second thermoelectric block body such that a serial connection is electrically established, and wherein the second thermoelectric block body is placed adjacent to the first thermoelectric block body such that an alternate pattern of the second thermoelectric block body differs from an alternate pattern of the first thermoelectric block body, and the second direction of alternate arrangement is substantially parallel with the first direction of alternate arrangement.

6. A thermoelectric module according to claim 5, wherein the at least one P piece of the first thermoelectric block body and the at least one P piece of the second thermoelectric block body comprise a cathode material of a thermocouple device, and wherein the at least one N piece of the first thermoelectric block body and the at least one N piece of the second thermoelectric block body comprise an anode material of the thermocouple device.

7. A thermoelectric module according to claim 5, wherein the at least one P piece of the first thermoelectric block body and the at least one second P piece of the second thermoelectric block body comprise alumel, and wherein the at least one N piece of the second thermoelectric block body and the at least one N piece of the second thermoelectric block body comprise chromel.

8. A thermoelectric module as described in claim 5, wherein the welded joints comprise micro welded joints.

9. A thermoelectric block body according to claim 2, wherein the welded joints comprise micro-welded joints.

10. A thermoelectric block body according to claim 3, wherein the welded joints comprise micro-welded joints.

11. A thermoelectric module as described in claim 6, wherein the welded joints comprise micro welded joints.

12. A thermoelectric module as described in claim 7, wherein the welded joints comprise micro welded joints.

13. A thermoelectric module according to claim 5, wherein a position of the at least one P piece in the first thermoelectric block body is identical to a position of the at least one N piece in the second thermoelectric block body.

14. A thermoelectric module according to claim 5, further comprising:

a second electrode on an opposite side of the thermoelectric module than said electrode, said second electrode attached to a second spatially facing pair of a P piece and an N piece that are placed at ends of the second thermoelectric block body and a third thermoelectric block body, the third thermoelectric block body having the alternate arrangement of the first thermoelectric block body, the second electrode allowing electric continuity to be established between the second spatially facing pair such that the first, second, and third thermoelectric block bodies are electrically connected in series.

* * * * *